(12) United States Patent
Li et al.

(10) Patent No.: US 12,310,053 B2
(45) Date of Patent: May 20, 2025

(54) SUPER-JUNCTION VDMOS DEVICE WITH LOW ON-RESISTANCE

(71) Applicant: Hangzhou Silicon-Magic Semiconductor Technology Co., Ltd, Hangzhou (CN)

(72) Inventors: Lvqiang Li, Hangzhou (CN); Hui Chen, Hangzhou (CN)

(73) Assignee: Hangzhou Silicon-Magic Semiconductor Technology Co., Ltd, Hangzhou (CN)

( * ) Notice: Subject to any disclaimer, the term of this patent is extended or adjusted under 35 U.S.C. 154(b) by 368 days.

(21) Appl. No.: 18/054,557

(22) Filed: Nov. 11, 2022

(65) Prior Publication Data

US 2023/0207619 A1  Jun. 29, 2023

(30) Foreign Application Priority Data

Dec. 23, 2021 (CN) .......................... 202111584948.2

(51) Int. Cl.
*H10D 30/66* (2025.01)
*H10D 62/10* (2025.01)
*H10D 62/82* (2025.01)

(52) U.S. Cl.
CPC ........... *H10D 30/66* (2025.01); *H10D 30/668* (2025.01); *H10D 62/111* (2025.01); *H10D 62/82* (2025.01)

(58) Field of Classification Search
CPC ..... H10D 30/66; H10D 30/668; H10D 62/111
See application file for complete search history.

(56) References Cited

U.S. PATENT DOCUMENTS 9,601,610 B1 * 3/2017 Khalil .................. H10D 30/477

* cited by examiner

*Primary Examiner* — Peter M Albrecht
(74) *Attorney, Agent, or Firm* — Osha Bergman Watanabe & Burton LLP

(57) ABSTRACT

A super-junction VDMOS device with a low on-resistance includes: a super-junction structure disposed on a drain region; a super-junction structure having a first semiconductor pillar and a second semiconductor pillar. A HEMT structure having heterojunctions is formed between the first semiconductor pillar and the second semiconductor pillar. The HEMT structure includes a first semiconductor material pillar and a second semiconductor material pillar. Heterojunctions are formed in the super-junction structure to form the HEMT structure, inducing two-dimensional electronic gas to facilitate electrical conduction, such that the on-resistance of the VDMOS device is significantly reduced. The voltage difference between the first semiconductor pillar and the second semiconductor pillar in the super-junction structure is utilized to control a cutting-off behavior of the HEMT structure. The two-dimensional electronic gas is depleted when a high drain-source voltage difference is applied between the source region and the drain region, rendering the VDMOS device high-voltage resistant.

9 Claims, 3 Drawing Sheets

SUPER-JUNCTION VDMOS DEVICE WITH LOW ON-RESISTANCE

FIELD OF TECHNOLOGY

The present disclosure relates to power semiconductor devices, in particular, to a super-junction VDMOS device with a low on-resistance.

BACKGROUND

Power devices have been emerging in various applications, and are widely used in DC-DC converters, DC-AC converters, relays, motor drivers, and the like. Vertical double-diffused metal oxide semiconductor field effect transistor (VDMOSFET, or VDMOS) devices, compared with bipolar transistors, are advantageous for their high switching speed, low power loss, high input impedance, low driving power, good frequency characteristics, and high transconductance linearity. Therefore, VDMOS devices have been widely adopted in modern power devices. However, conventional VDMOS devices come with inherent disadvantages.

For example, the on-resistance increases with the breakdown voltage in conventional VDMOS devices, which further leads to a rapid increase in power consumption. However, the emergence of charge-balancing devices, such as super-junction VDMOS devices, has the capability of reducing the constraint between the on-resistance and the breakdown voltage, and simultaneously achieving a low on-state power consumption and a high blocking voltage. As a result, super-junction VDMOS devices are now applied in various energy-efficient scenarios and have a promising future. A power super-junction VDMOS device have alternately arranged P-pillars and N-pillars, unlike traditional power devices, which are based on N drifting regions. When a power super-junction VDMOS device is in a cut-off state and reverse-biased, the combined effect of a transverse electric field (e.g., in x direction) and a longitudinal electric field (e.g., in y direction) will cause the P-pillars and the N-pillars to be completely depleted. The longitudinal electric field in the depletion region tends to be uniform, and therefore, the breakdown voltage is theoretically dependent only on the thickness of the voltage withstanding layer, but irrelevant to the dopant concentration of the voltage withstanding layer. The dopant concentration of the voltage withstanding layer can be increased by nearly an order of magnitude, which effectively reduces the on-resistance of the power super-junction VDMOS device and the power consumption.

The super-junction VDMOS device in conventional arts, however, is limited by its materials, the migration rate of carriers in the materials, and the tradeoffs between the on-resistance and breakdown voltage. Therefore, it is technically difficult to further reduce the on-resistance of the VDMOS device.

SUMMARY

The present disclosure provides a super-junction vertical double-diffused metal oxide semiconductor field effect transistor (VDMOS) device with a low on-resistance, comprising: a drain region, which is of a first dopant type; a super-junction structure, disposed on the drain region; a body region, which is of a second dopant type and disposed on the super-junction structure; a source region, which is of the first dopant type; and a gate structure; wherein the super-junction structure comprises a first semiconductor pillar, which is of the first dopant type, and a second semiconductor pillar, which is of the second dopant type, wherein the first semiconductor pillar and the second semiconductor pillar are alternately arranged and are adjacent to each other, wherein the second semiconductor pillar is disposed below the body region, and the first semiconductor pillar is disposed below the gate structure, wherein a high-electron-mobility transistor (HEMT) structure formed by heterojunctions is disposed at an interface between the first semiconductor pillar and the second semiconductor pillar; wherein the HEMT structure comprises a first semiconductor material pillar and a second semiconductor material pillar, wherein the first semiconductor material pillar is closer to the first semiconductor pillar, and the second semiconductor material pillar is closer to the second semiconductor pillar, wherein the HEMT structure is disposed on a surface of the drain region and is not in contact with the body region, wherein a first two-dimensional electronic gas (2DEG) region is formed between the second semiconductor material pillar and the second semiconductor pillar, and a second 2DEG region is formed between the first semiconductor material pillar and the second semiconductor material pillar.

In one or more embodiments, the drain region, the super-junction structure, the body region, and the source region comprise SiC; the first semiconductor material pillar comprise GaN; the second semiconductor material pillar comprise AlGaN.

In one or more embodiments, the drain region, the super-junction structure, the body region and the first type semiconductor source region comprise 4H—SiC.

In one or more embodiments, the drain region, the super-junction structure, the body region, and the source region comprise Si; the first semiconductor material pillar comprises GaAs; the second semiconductor material pillar comprises AlGaAs.

In one or more embodiments, wherein the first dopant type is N type, and the second dopant type is P type; or the first dopant type is P type, and the second dopant type is N type.

In one or more embodiments, the gate structure is of a planar gate structure or of a trench gate structure.

In one or more embodiments, the drain region is in ohmic contact with a metal drain electrode.

In one or more embodiments, the body region comprises an ohmic contact layer, which is of the second dopant type.

In one or more embodiments, the ohmic contact layer and the source region are in ohmic contact with the metal source electrode.

DETAILED DESCRIPTION

Figure 1:
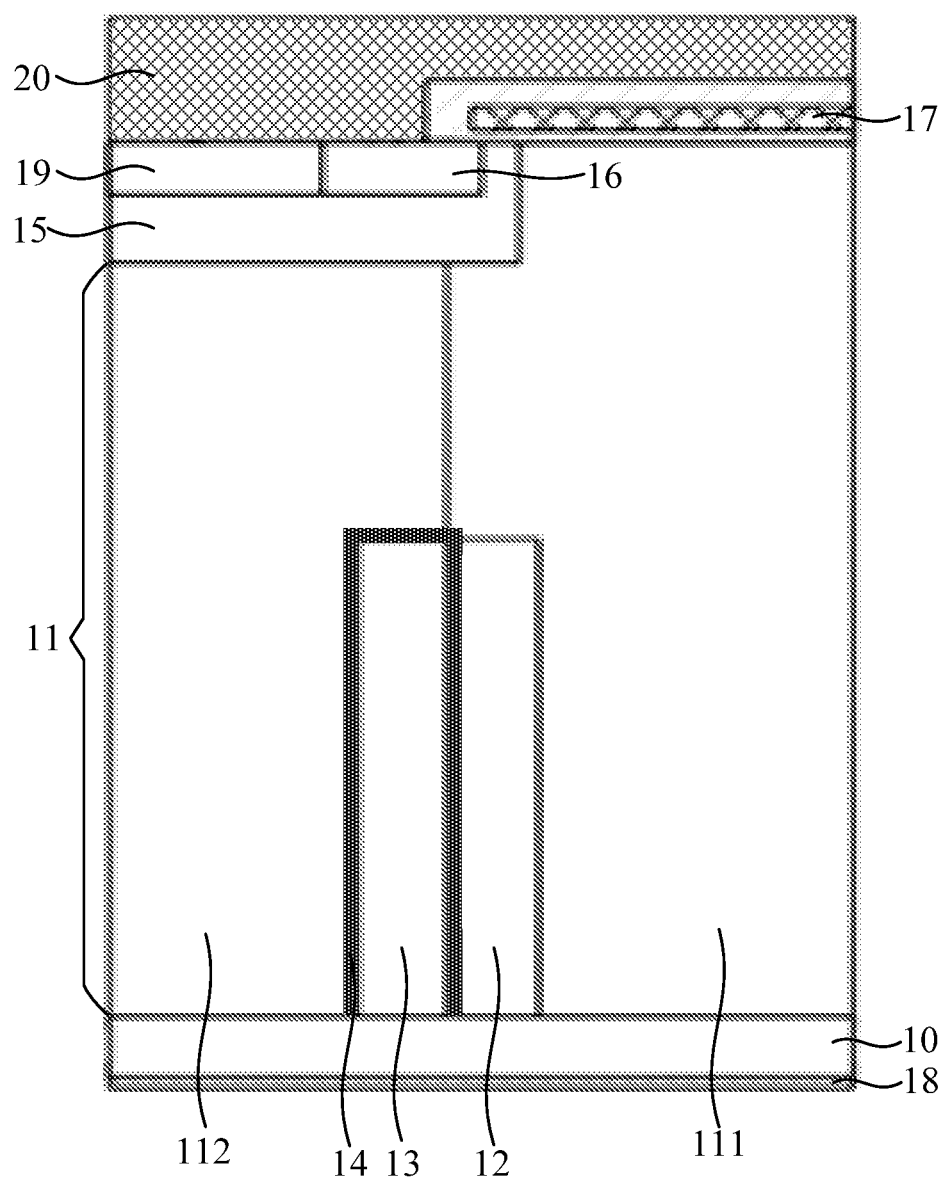
FIG. 1 shows a schematic cross-section of a super-junction VDMOS device with a low on-resistance according to one or more embodiments of the present disclosure, wherein its gate is of a planar gate structure.

The following embodiments of the specification are illustrated by specific examples, those skilled in the art may easily understand other advantages and efficacy of the present disclosure by the contents disclosed in this specification. The present disclosure may also be implemented or applied by other specific embodiments, the details of the specification may also be based on different views and applications, without departing from the spirit of the present application under various modifications or changes.

Referring to FIGS. 1 through 4, it should be noted that the drawings provided in the embodiments illustrate only the basic concept of the present application in a schematic manner, so that only components highly related to the present application are shown in the drawings and the components are not necessarily shown in accordance with the number, shape, and size of the components. In actual implementation, the type, amount, and proportion of each component can be modified according to actual needs, and the layout of the components may also be more complex.

Figure 2:
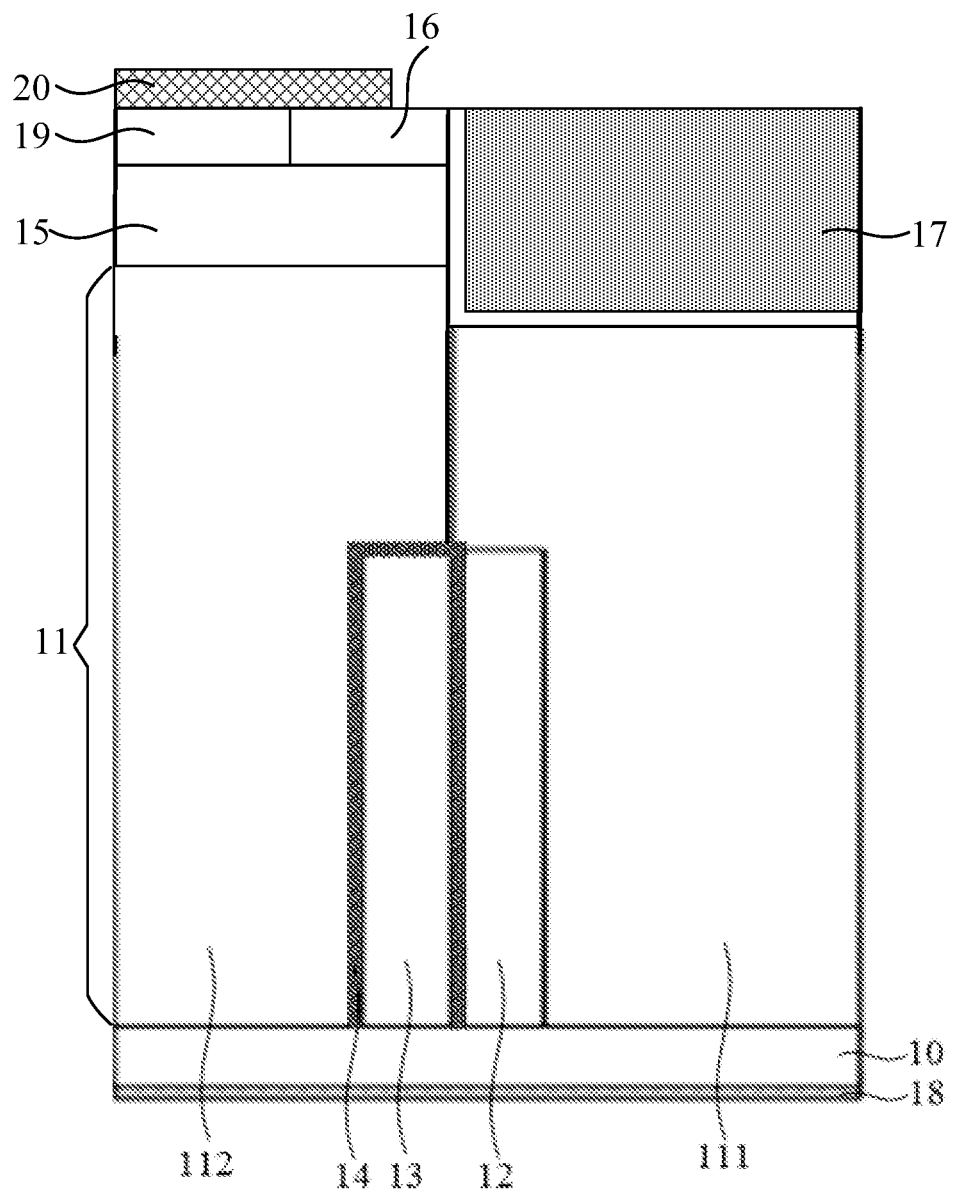
FIG. 2 shows a schematic cross-section of a super-junction VDMOS device with a low on-resistance according to one or more embodiments of the present disclosure, whose gate has a trench gate structure.

As shown in FIGS. 1 and 2, the present disclosure provides a super-junction VDMOS device with a low on-resistance. The super-junction VDMOS device comprises: a drain region 10, which is of a first dopant type, a super-junction structure 11 disposed on the drain region 10, a body region 15, which is of a second dopant type and disposed on the super-junction structure 11, and a source region 16, which is of the first dopant type, and a gate structure 17.

The super-junction structure 11 comprises a first semiconductor pillar 111, which is of the first dopant type, and a second semiconductor pillar 112, which is of the second dopant type; the first semiconductor pillar 111 and the second semiconductor pillar 112 are alternately arranged along a transverse direction and are adjacent to each other. Furthermore, the second semiconductor pillar 112 is disposed below the body region 15, and the first semiconductor pillar 111 is disposed below the gate structure 17; a high-electron-mobility transistor (HEMT) structure formed by heterojunctions is disposed at an interface between the first semiconductor pillar 111 and the second semiconductor pillar 112.

The HEMT structure comprises a first semiconductor material pillar 12 and a second semiconductor material pillar 13. The first semiconductor material pillar 12 is disposed closer to an interface of the first semiconductor pillar 111, and the second semiconductor material pillar 13 is disposed closer to an interface of the second semiconductor pillar 112. The HEMT structure is disposed on a surface of the drain region 10, and is not in contact with the body region 15. A two-dimensional electronic gas (2DEG) region 14 is formed where the second semiconductor material pillar 13 and the second semiconductor pillar 112 come into contact, and where the first semiconductor material pillar 12 and the second semiconductor material pillar 13 come into contact.

In the super-junction VDMOS device with a low on-resistance of the present disclosure, the on-resistance is significantly reduced by adopting heterojunctions in the super-junction structure to form the HEMT structure, which induces two-dimensional electronic gas for electrical conduction. The voltage difference between the first semiconductor pillar 111 and the second semiconductor pillar 112 is utilized to control the cutting-off behavior of the HEMT structure, ensuring that two-dimensional electronic gas can persist on surfaces of the heterojunctions when a low drain-source voltage difference is applied between the source region and the drain region, thereby effectively reducing the on-resistance of the VDMOS device. The two-dimensional electronic gas is depleted when a high drain-source voltage difference is applied between the source region and the drain region, allowing the VDMOS device to be high-voltage resistant. Therefore, the proposed super-junction VDMOS device ensures effective on-resistance reduction while maintaining a high breakdown voltage.

Figure 3:
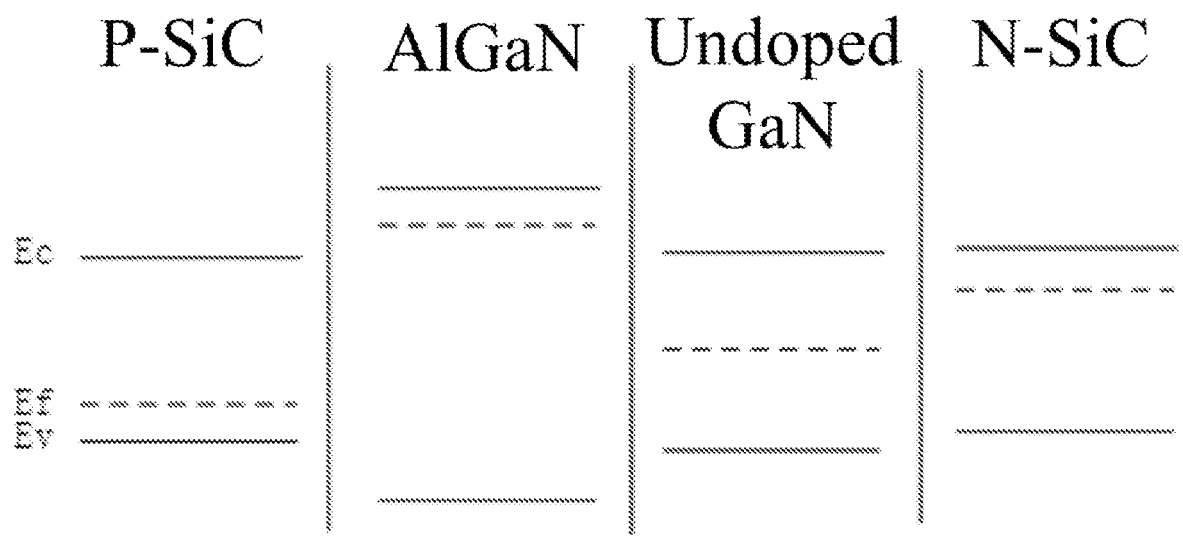
FIG. 3 shows energy bands of materials of a super-junction VDMOS device with a low on-resistance according to one or more embodiments of the present disclosure, when the materials are not in contact with each other.
Figure 4:
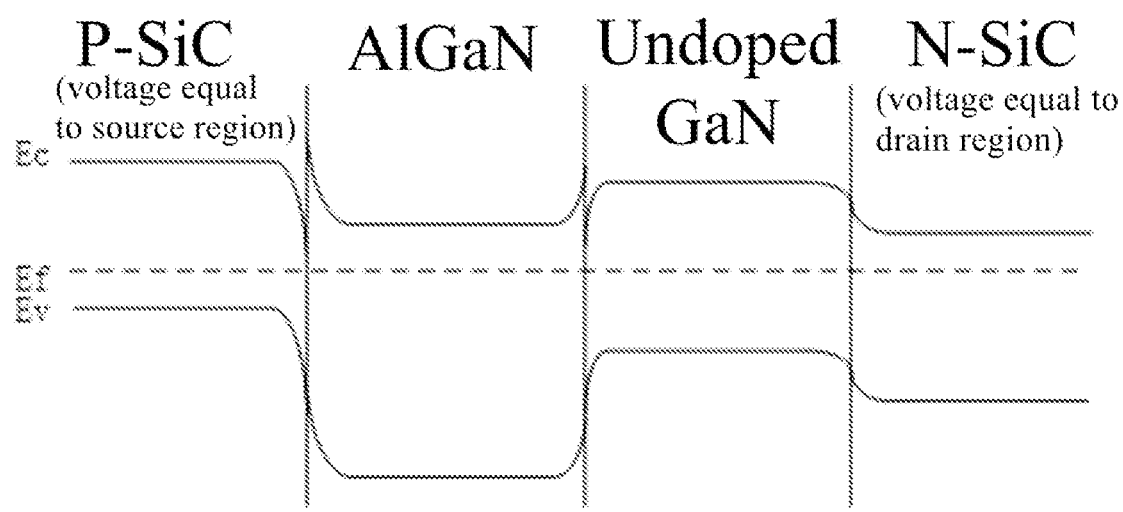
FIG. 4 shows energy bands of materials of a super-junction VDMOS device with a low on-resistance according to one or more embodiments of the present disclosure, when the materials are in contact with each other and $V_{ds}$=0V.

In a non-limiting example, a material of the super-junction VDMOS device is silicon carbide (SiC), and a material of the HEMT structure is gallium nitride (GaN) or aluminum gallium nitride (AlGaN). As a non-limiting example, the drain region 10, the super-junction structure 11, the body region 15, and the source region 16 may comprise SiC, such as quad-hydrogen SiC (4H—SiC). A material of the first semiconductor material pillar 12 may be GaN, and the second semiconductor material pillar 13 may comprise AlGaN. In one or more embodiments, the first dopant type is N type whereas the second dopant type is P type. 4H—SiC is known as a wide-bandgap semiconductor material with a bandgap of 3.26 electron-volt (eV). GaN has a bandgap of 3.4 eV, and the bandgap of AlGaN materials is in a controllable range of 3.4 eV to 6.0 eV, depending on the concentration of aluminum in the AlGaN materials. GaN and AlGaN have different bandgaps, and a GaN region and an AlGaN region may form a heterojunction when they come into contact, in which case electrons from the AlGaN region will flow to the GaN region, forming a positively-charged space in AlGaN, and a two-dimensional electron gas (2DEG) region is formed on a surface of GaN. FIG. 3 shows the energy bands of materials in the super-junction structure and the HEMT structure before the materials come into contact with each other. As shown in FIG. 4, the energy bands are twisted at the junctions where the materials come into contact. A 2DEG region 14 is formed between the second semiconductor material pillar 13 and the second semiconductor pillar 112 (i.e., the AlGaN/P—SiC interface), and another 2DEG region 14 is formed between the first semiconductor material pillar 12 and the second semiconductor material pillar 13 (i.e., the GaN/AlGaN interface). In such a super-junction structure 11, the voltage of the second semiconductor pillar 112 is equalized to that of the source region 16, and the voltage of the first semiconductor pillar 111 is equalized to that of the drain region 10. Therefore, when the drain-source voltage difference between the source region and the drain region is zero ($V_{ds}$=0), the 2DEG regions 14 exist in the VDMOS device. When the VDMOS device is in operation, the drain-source voltage difference $V_{ds}$ is always greater than zero regardless of whether the VDMOS device is turned on or cut off, which causes the potential of the second semiconductor pillar 112 side, i.e., the P—SiC portion, to drop, and the potential on the first semiconductor pillar 111 side, i.e., the N—SiC portion, to rise. Meanwhile, as shown in the energy bands of FIG. 4, the potential of the P—SiC portion is uplifted, and the potential of the N—SiC portion is reduced. Thus, the 2DEG regions 14 are restricted by depletion effects of the second semiconductor pillar 112 and the first semiconductor pillar 111. The band widths and concentrations of the AlGaN region and GaN region are controllable factors, which renders a controllable voltage difference between the P/N pillars in the super-junction structure 11, and the voltage difference between the P/N pillars can further be utilized to control the cutting-off behavior of the HEMT structure. For example, when the VDMOS device is turned on, the gate-source voltage difference is greater than 0 ($V_{gs}>0$), and the drain-source voltage difference is greater than 0 ($V_{ds}>0$); since the drain-source voltage difference Vds is a relatively small forward on-voltage, the depletion effects of the P/N pillars are not strong, allowing the 2DEG regions to persist, and consequently, the on-resistance can be significantly reduced. When the VDMOS device is cut off, the gate-source voltage difference is zero ($V_{gs}=0$), the drain-source voltage difference is greater than 0 ($V_{ds}>0$), and the drain-source voltage difference $V_{ds}$ keeps increasing gradually. The P—SiC and N—SiC portions above the AlGaN/GaN portions may be depleted in an early stage to partially withstand the drain-source voltage difference $V_{ds}$. Thereafter, the drain-source voltage difference $V_{ds}$ continues to increase, which broadens the depletion zone and keeps depleting the 2DEG. When a high drain-source voltage difference is applied, the 2DEG will be eventually depleted, allowing the VDMOS device to be high-voltage resistant. Moreover, since GaN has a wider bandgap, the voltage blocking capability of the VDMOS device can be further improved. Therefore, the embodiments described can effectively reduce the on-resistance while ensuring a high breakdown voltage of the VDMOS device, and even increase the breakdown voltage.

The above embodiments are illustrated with the first dopant type being N type and the second dopant type being P type. In practice, the first dopant type may also be P type, and the second dopant type may also be N type.

By way of example, the material of the super-junction VDMOS device may also be silicon (Si), and the HEMT structure may be made of GaAs/AlGaAs. That is, the drain region 10, the super-junction structure 11, the body region 15, and the source region 16 can be made of material Si, the first semiconductor material pillar 12 in the HEMT structure is made of GaAs, and the second semiconductor material pillar 13 is made of AlGaAs.

As shown in a non-limiting example of FIG. 1, the gate structure 17 in the super-junction VDMOS device may be of a planar gate structure. As shown in FIG. 2, the gate structure 17 in the super-junction VDMOS device may also be of a trench gate structure. The gate structure 17 may also be of any conventional structure for gates.

As shown in FIGS. 1 and 2, a metal drain electrode 18 is disposed below the drain region 10 to realize an ohmic contact therebetween. The metal drain electrode 18 is also utilized to realize electrode lead-out.

As shown in FIGS. 1 and 2, the body region 15 is provided with an ohmic contact layer 19, which is of the second dopant type. In one or more embodiments, a metal source electrode 20 is formed on and is in an ohmic contact with the ohmic contact layer 19 and the source region 16, so that the metal source 20 can be utilized to realize electrode lead-out.

In a non-limiting example, the first semiconductor pillar 111 and the second semiconductor pillar 112 may be complementary tilted pillars. That is, the first semiconductor pillar 111 and the second semiconductor pillar 112 are tilted, with respect to the drain region 10, at two opposite angles (e.g., −10 degrees and 10 degrees). In another example, the first semiconductor pillar 111 and the second semiconductor pillar 112 are not tilted, in which case, the pillars are doped such that there are gradients of dopant concentrations within the pillars, and as a result the electric field at a central region of the super-junction structure 11 is greater than that of two ends of the super-junction structure 11.

In summary, in the super-junction VDMOS device with a low on-resistance provided by the present disclosure, the on-resistance is significantly reduced by adopting heterojunctions in the super-junction structure to form the HEMT structure, which induces two-dimensional electronic gas for conductivity. The voltage difference between the first semiconductor pillar and the second semiconductor pillar of the super-junction structure is utilized to control the cutting-off behavior of the HEMT structure, ensuring that two-dimensional electronic gas can persist on surfaces of the heterojunctions when a low drain-source voltage difference is applied between the source region and the drain region, thereby effectively reducing the on-resistance of the VDMOS device. The two-dimensional electronic gas is depleted when a high drain-source voltage difference is applied between the source region and the drain region, allowing the VDMOS device to be high-voltage resistant. Therefore, the proposed super-junction VDMOS device ensures effective on-resistance reduction while maintaining a high breakdown voltage. Therefore, the embodiments in the present disclosure effectively overcome the various shortcomings of the conventional art and have a high industrial value.

The above embodiments illustrate only the principles of the present disclosure and their efficacy, and are not intended to limit the present disclosure. Anyone familiar with this technique may modify or change the above embodiments without violating the spirit and scope of the present disclosure. Accordingly, all equivalent modifications or alterations made by persons with general knowledge in the technical field to which they belong, without departing from the spirit and technical ideas revealed in the present disclosure, shall still be covered by the claims of the present disclosure.

What is claimed is:

1. A super-junction vertical double-diffused metal oxide semiconductor field effect transistor (VDMOS) device with a low on-resistance, comprising:
    a drain region, which is of a first dopant type;
    a super junction structure, disposed on the drain region;
    a body region, which is of a second dopant type and disposed on the super junction structure;
    a source region, which is of the first dopant type; and
    a gate structure;
    wherein the super junction structure comprises a first semiconductor pillar, which is of the first dopant type, and a second semiconductor pillar, which is of the second dopant type,
    wherein the first semiconductor pillar and the second semiconductor pillar are alternately arranged and are adjacent to each other,
    wherein the second semiconductor pillar is disposed below the body region, and the first semiconductor pillar is disposed below the gate structure,
    wherein a high-electron-mobility transistor (HEMT) structure having heterojunctions is disposed at an interface between the first semiconductor pillar and the second semiconductor pillar;
    wherein the HEMT structure comprises a first semiconductor material pillar and a second semiconductor material pillar,
    wherein the first semiconductor material pillar is disposed closer to the first semiconductor pillar, and the second semiconductor material pillar is disposed closer to the second semiconductor pillar,
    wherein the HEMT structure is disposed on a surface of the drain region and is not in contact with the body region, and
    wherein a first two-dimensional electronic gas (2DEG) region is formed between the second semiconductor material pillar and the second semiconductor pillar, and a second 2DEG region is formed between the first semiconductor material pillar and the second semiconductor material pillar.

2. The super-junction VDMOS device of claim 1, wherein:
the drain region, the super junction structure, the body region, and the source region comprise SiC;
the first semiconductor material pillar comprises GaN; and
the second semiconductor material pillar comprises AlGaN.

3. The super-junction VDMOS device of claim 1, wherein the drain region, the super junction structure, the body region and the first type semiconductor source region comprise 4H—SiC.

4. The super-junction VDMOS device of claim 1, wherein:
the drain region, the super-junction structure, the body region, and the source region comprise Si;
the first semiconductor material pillar comprises GaAs; and
the second semiconductor material pillar comprises AlGaAs.

5. The super-junction VDMOS device of claim 1, wherein the first dopant type is N type, and the second dopant type is P type; or the first dopant type is P type, and the second dopant type is N type.

6. The super-junction VDMOS device of claim 1, wherein the gate structure comprises a planar gate structure or a trench gate structure.

7. The super-junction VDMOS device of claim 1, wherein the drain region is in ohmic contact with a metal drain electrode.

8. The super-junction VDMOS device of claim 7, wherein the body region comprises an ohmic contact layer, which is of the second dopant type.

9. The super-junction VDMOS device of claim 8, wherein the ohmic contact layer and the source region are in ohmic contact with a metal source electrode.

* * * * *